United States Patent [19]

Burke, Jr.

[11] 4,066,958

[45] Jan. 3, 1978

[54] COMPENSATED GALVANOMETER

[75] Inventor: Edward Burke, Jr., Reading, Mass.

[73] Assignee: MFE Corporation, Salem, N.H.

[21] Appl. No.: 697,103

[22] Filed: June 17, 1976

[51] Int. Cl.$^2$ .................... G01R 1/14; G01D 11/10
[52] U.S. Cl. ................................. 324/125; 73/430;
324/99 R
[58] Field of Search ............... 324/125, 99 R; 73/430;
318/617, 621, 622

[56] References Cited

U.S. PATENT DOCUMENTS 3,281,688  10/1966  Brown, Jr. et al. .............. 324/125
3,686,568  8/1972  MacMullan et al. ............ 324/99 R Primary Examiner—John Kominski
Assistant Examiner—Ernest F. Karlsen
Attorney, Agent, or Firm—Cesari & McKenna

[57] ABSTRACT

A limited-displacement device is provided with an extended frequency range by critically damping it and compensating its frequency characteristics with a pair of series lead compensation circuits whose break-point frequency matches the natural frequency of the mechanical parts of the system.

5 Claims, 1 Drawing Figure

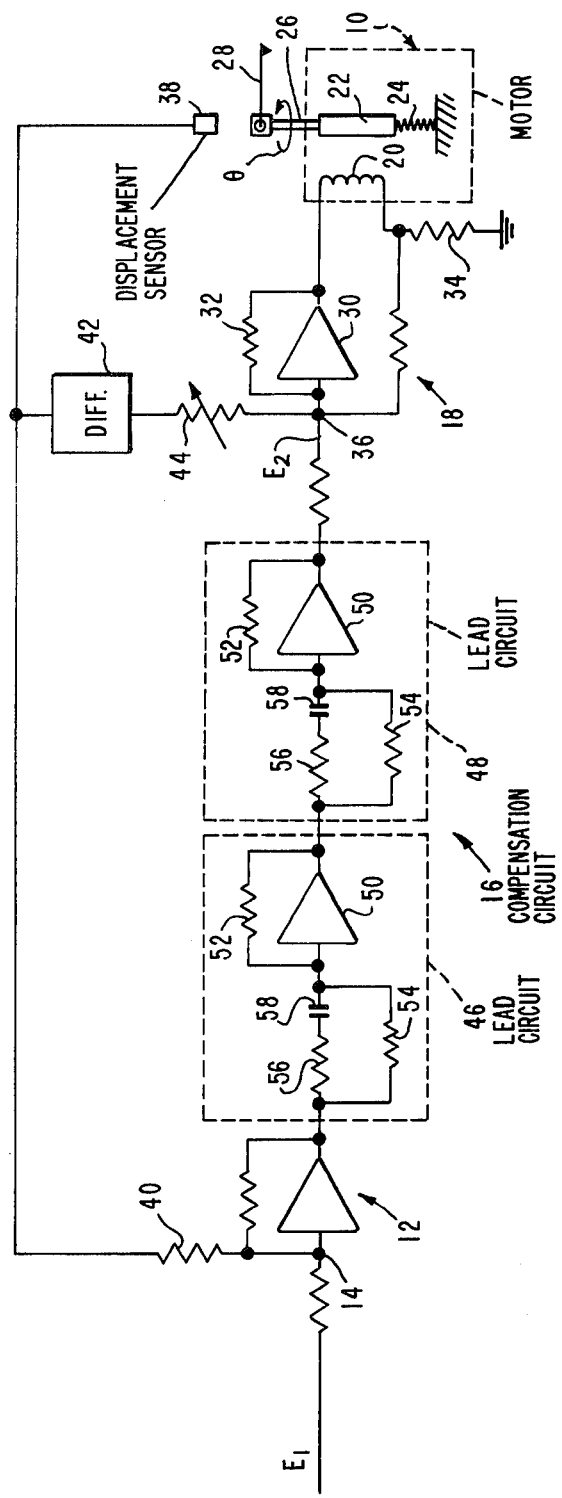

COMPENSATED GALVANOMETER

BACKGROUND OF THE INVENTION

1. Field of the Invention

This invention relates to a limited-displacement device such as a galvanometer whose displacement corresponds with the magnitude of an electric signal supplied thereto. More specifically, the invention relates to the use of frequency and phase compensation to provide a galvanometer with an extended frequency range.

2. Prior Art

Limited-rotation motors are used extensively in instruments which rotate to an angular position that corresponds with an input voltage or current. The motor may be used to deflect a light beam by rotating a mirror or a light source or it may move a recording pen in a strip chart recorder that records the value of a monitored parameter as a function of time. These motors, together with the components rotated by them, are generally called galvanometers. As used herein the term "galvanometer" also includes other limited-displacement devices which undergo reciprocal rotational or linear motion in response to an applied signal. These devices include, for example, optical scanners which reciprocate mirrors in response to predetermined input signals.

A galvanometer usually comprises, in addition to the motor, a spring that urges the motor into a neutral position and against which the motor must rotate in order to displace an output element. The motor is usually an electromagnetic transducer whose torque is proportional to the electric current passed through it and the spring is linear, i.e., its torque is proportional to its angular displacement. The displacement is therefore proportional to the current. If an output displacement proportional to an applied voltage is desired, the system includes circuitry that provides a motor current proportional to the applied voltage.

However, the various components of a galvanometer, primarily the spring and the moving mass, form a resonant system and the proportionality between the output displacement and the magnitude of the input signal therefore varies with frequency. Indeed, the displacement drops off sharply at frequencies greater than the resonant frequency of the system. This can limit the response of the galvanometer to relative low frequencies, e.g., 50 Hz or less.

One can pass the input signal through a compensating network to increase the displacement at frequencies above the resonant frequency. However, a circuit that compensates the displacement in this manner will not, in general, compensate for the varying phase characteristic of the output. Accordingly, there is a substantial variation of phase as a function of the frequency of the input signal and this is especially significant in closed-loop systems in which the output displacement is compared with an input signal and the resulting error signal is used to drive the motor. Specifically, the phase deviation can cause instability unless the gain and bandwidth are severely limited.

OBJECTS OF THE INVENTION

Accordingly, it is an object of the present invention to provide a galvanometer having an extended frequency range.

Another object of the invention is to provide a galvanometer suitable for operation in a high-gain position-feedback loop. A more specific object of the invention is to provide a galvanometer characterized by a relatively constant amplitude and phase response over an extended frequency range.

SUMMARY OF THE INVENTION

The present invention makes use of the characteristics of a critically-damped mechanical assembly in a galvanometer. Specifically, when the mass-spring system of a galvanometer is essentially critically damped, the amplitude of the displacement varies with frequency in the same manner as the transfer function of a two-section lag circuit. For example, at the angular resonant frequency, $\omega_o$, the output amplitude is one-half the amplitude at low frequencies and, at higher frequencies, the amplitude falls off at a rate asymptotic to 2 log units per decade. This amplitude characteristic and the corresponding phase characteristic can be exactly compensated by a two-section lead circuit in which each section has a time constant equal to $1/\omega_o$. That is, in the output of the lead circuit, the response at $\omega_o$ is twice the low-frequency response and the output at high frequencies increases at a rate asymptotic to 2 log units per decade.

Accordingly, by using the lead circuit in a series compensation arrangement, I obtain a flat overall response, i.e., a zero phase shift and an output amplitude that does not vary with frequency, both these characteristics extending to relatively high frequencies, where second order effects become significant.

BRIEF DESCRIPTION OF THE DRAWING

The drawing is a schematic diagram of a compensated galvanometer embodying the invention.

DETAILED DESCRIPTION OF THE INVENTION

As shown in the drawing a galvanometer incorporating the present invention includes a limited-rotation motor 10 connected for rotation in response to an input signal $E_1$ that is applied to an input amplifier stage 12 by way of a summing junction 14. The output of the stage 12 passes through a compensation circuit 16 to an output amplifier stage 18. The output stage 18, in turn, provides the current for a control winding 20 in the motor 10. This current results in a torque on a motor armature 22, which rotates against a torsion spring 24. The armature has a shaft 26 at the outer end of which is a stylus 28 of the type used to record signals in strip chart recorders.

The motor 10 is preferably of the type described in U.S. Pat. No. Re26,749. However, the invention is equally applicable to other limited-rotation motors such as, for example, d'Arsonval motors.

The torque on the armature 22 is proportional to the current through the winding 20. On the other hand, the input to the output stage 18 is in the form of a voltage, $E_2$, corresponding to a monitored parameter. The stage 18 therefore includes inverse current feedback to provide an output current proportional to the voltage $E_2$.

Specifically, the stage 18 includes an amplifier 30 whose output current passes through both the motor winding 20 and a series transistor 34. The voltage across the resistor 34 is fed back to a summing junction 36, where it is subtracted from the voltage $E_2$ to provide an input for the amplifier 30. The amplifier stage 18 is thus essentially a constant-current source for the motor winding 20, with the current, and thus the armature torque, being proportional to the voltage $E_2$. Constant current source is used here in its conventional sense to mean that the current supplied by the amplifier stage 18 at a given input voltage $E_2$ is maintained essentially constant despite variations in the impedance of the motor winding 20. The current supplied by the stage 18 is, however, proportional to the voltage $E_2$.

The galvanometer also includes a displacement sensor 38 that provides a voltage whose instantaneous value corresponds with the angular position of the armature 22. The displacement sensor 38 may be any conventional device for producing a voltage corresponding to the angular position of the armature 22. Variable capacitance transducers are commonly used for this purpose. A typical such transducer includes a pair of spaced-apart stationary plates between which is disposed a movable plate coupled to rotate with the motor armature. The output capacitance of the transducer and associated circuitry is a function of armature displacement. Typical transducers of this general type are disclosed, for example, in U.S. Pat. Nos. 3,517,282 and 3,668,672. The output of the sensor 38 is fed back to the summing junction 14 where it is subtracted from the input voltage $E_1$ for closed loop operation of the galvanometer. The output of the sensor 38 is also passed through a differentiator 42 to provide a signal corresponding to the angular velocity of the armature 22. This signal is fed back to the junction 36 to provide inverse rate feedback for the output stage 18. The rate feedback has the effect of viscous damping of the motor 10. The amount of this feedback is adjusted by means of a variable summing resistor 44 to provide substantially critical damping of the motor 10 so as to obtain the desired transfer function between the displacement of the pen 28 and the voltage $E_2$.

At the frequencies of interest, electrical effects in the motor 10, such as inductance and capacitance in the winding 20, can be neglected in comparison with the mechanical parameters. Accordingly, the response of the motor 10 is accurately described by:

$$\tau = bE_2 = I\frac{d\Omega}{dt} + k\theta + m\Omega \qquad (1)$$

where:
$\tau$ is the torque exerted on the armature 22,
$b$ is a constant of proportionality,
$I$ is the moment of inertia of the armature 22 and the components rotated thereby,
$\Omega$ is the angular velocity of the armature 22,
$\theta$ is the angular displacement of the armature from its neutral position,
$k$ is the spring constant of the torsion spring 24, and
$m$ is the damping constant.

Formula (1) can be rewritten as follows in terms of the input frequency, $\omega$:

$$bE_2 = Is^2\theta + k\theta + ms\theta \qquad (2)$$

where:

$$s = j\omega$$

Solving for the transfer function, $\theta/E_2$, of the final stage 18 and motor 10:

$$\frac{\theta}{E_2} = b\frac{1}{Is^2 + k + ms} \qquad (3)$$

$$+ b\frac{1}{(K - I\omega^2) + jm\omega} \qquad (4)$$

For critical damping, $$m = 2k/\omega_o \qquad (5)$$

where $$\omega_o = 2\pi\sqrt{k/I} \qquad (6)$$

is the angular natural frequency of the undamped mass-spring system of the motor 20 and the parts attached thereto.

Finally, substituting from (5) and (6):

$$\frac{\theta}{E_2} = \frac{b}{k}\frac{1}{(1 - \frac{\omega^2}{\omega_o^2}) + j\frac{2\omega}{\omega_o}} \qquad (7)$$

The transfer function (7) indicates a maximum output amplitude and zero phase shift at zero frequency. At the frequency $\omega = \omega_o$, the amplitude is one-half its maximum value and there is a phase lag of 90°. At high frequencies, the amplitude decreases at a rate of 2 log units per decade and the phase lag approaches 180°.

The compensation circuit 16 comprises a pair of identical cascaded lead networks 46 and 48. Each of these networks, in turn, comprises an amplifier 50, a resistor 52 connected between the amplifier output and input terminals for negative feedback, a series input resistor 54 and the series combination of a resistor 56 and capacitor 58 in parallel with the resistor 54. Over the frequency range of operation, the resistance $R_{56}$ is substantially less than the reactance of the capacitor 58 and therefore it can be neglected in the following analysis.

The transfer function $H_o$, of each of the lead networks 46 and 48 is given by $$H_o = \frac{R_{52}}{R_{54}}(j\omega R_{54}C_{58} + 1) \qquad (8)$$

The circuit values are selected so that the time constant $R_{54}C_{58} = 1/\omega_o$ and $\omega_o$ is therefore the "break-point frequency" of the network. Accordingly, $$H_o = \frac{R_{52}}{R_{54}}(j\frac{\omega}{\omega_o} + 1) \qquad (9)$$

The combined transfer function, $H_1$, of the networks 46 and 48 is thus $$H_1 = H_o^2 = (\frac{R_{52}}{R_{54}})^2[1 - (\frac{\omega}{\omega_o})^2 + j\frac{2\omega}{\omega_o}] \qquad (10)$$

The transfer function $H_1$ has a frequency characteristic that is the opposite of that of the function $\theta/E_2$, and thus provides exact frequency compensation for the motor 10. More specifically, with these two transfer functions, the overall open-loop transfer function, $\theta/E_1$, is given by $$\frac{\theta}{E_1} = cH_1\frac{\theta}{E_2} \qquad (11)$$

-continued $$= c[1 - (\frac{\omega}{\omega_o})^2 + j\frac{2\omega}{\omega_o}][\frac{1}{1-\left(\frac{\omega}{\omega_o}\right)^2 + j\frac{2\omega}{\omega_o}}] \quad (12)$$

$$= c$$

where $c$ is the zero-frequency, open-loop again of the galvanometer.

With a circuit of the type shown in the drawing, I have been able to obtain an essentially flat open-loop response up to a frequency of 150 Hz with a motor and stylus having a natural frequency, $\omega_o/2\pi$, of 50 Hz. At higher frequencies second-order effects such as winding inductance and capacitance become significant and the foregoing analysis is no longer accurate. The compensation circuit 16, therefore, does not then fully compensate for the characteristics of the motor 10. Accordingly, I reduce the gain at such frequencies so as to preserve stability in closed-loop operation. This is accomplished by means of the resistors 56 in the lead circuits 46 and 48. As the input frequency increases, the resistances of these resistors become significant as compared with the reactances of the capacitors 58. This limits the increase in the magnitude of the transfer function, $H_1$, as a function of increasing frequency and, at sufficiently high frequency, $H_1$ becomes essentially constant. The system then has the 2 log-units-per-decade response characteristic of the damped motor 10.

By way of example, with a motor resonant frequency, $\omega_o/2\pi$, of 55 Hz, the resistors 52 and 54 may have a value of 160,000 ohms and the resistors 56 a value of 500 ohms, with a capacitance $C_{58}$ of 0.018 microfarads. Additionally, a small capacitance (not shown) may be connected in parallel with each of the resistors 52 to reduce further the gain at very high frequencies, e.g., around 10 kHz and above. This is especially desirable when the sensor 38 is a carrier frequency device, since it avoids amplification of stray carrier frequency pickup and consequent saturation of the amplifiers.

I claim:

1. A galvanometer of the type comprising a limited displacement motor, an output element displaced by said motor in response to an input signal applied to the galvanometer, and resilient means urging said motor to a neutral position, the galvanometer having a resonant angular frequency, $\omega_o$, said galvanometer further comprising
   A. means for essentially critically damping said motor so that the amplitude of the displacement of said output element varies with the frequency of the galvanometer input signal in essentially the same manner as the transfer function of a two-section lag circuit, and
   B. a series compensation circuit
      1. connected to pass the galvanometer input signal to said motor,
      2. having a double-lead characteristic, and
      3. having a break-point angular frequency of $\omega_o$.

2. A galvanometer as defined in claim 1 in which
   A. said compensation circuit comprises first and second identical, cascaded lead circuits, and
   B. each of said lead circuits has a break-point frequency of $\omega_o$.

3. A galvanometer as defined in claim 1 in which said compensation circuit has a transfer function whose frequency dependence is in accordance with the expression $$1 - \left(\frac{\omega}{\omega_o}\right)^2 + j\frac{2\omega}{\omega_o},$$

where $\omega$ is the angular frequency of the input to said compensation circuit.

4. A galvanometer as defined in claim 1 in which said damping means includes
   A. means for generating a velocity signal representing the velocity of said output element, and
   B. feedback means for inversely feeding back said velocity signal as a component of the signal applied to said motor.

5. A galvanometer as defined in claim 2 in which each lead circuit has a transfer function whose frequency dependence is in accordance with the expression $$j\frac{\omega}{\omega_o} + 1,$$

where $\omega$ is the angular frequency of the input to said lead circuit.

* * * * *